United States Patent
Smiley (10) Patent No.: US 7,091,774 B1
(45) Date of Patent: Aug. 15, 2006

(54) METHOD AND APPARATUS FOR COMBINING MULTIPLE SIGNALS FOR HIGH EFFICIENCY APPLICATIONS

(75) Inventor: Russell Smiley, Nepean (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 11/248,655

(22) Filed: Oct. 12, 2005

Related U.S. Application Data (63) Continuation-in-part of application No. 10/449,105, filed on Jun. 2, 2003.

(51) Int. Cl.
*H03F 3/68* (2006.01)

(52) U.S. Cl. .................................. 330/124 R; 330/295

(58) Field of Classification Search ............ 330/124 R, 330/295, 10, 207 A, 251, 302; 333/126, 333/129, 132, 134, 174, 175, 176
See application file for complete search history.

(56) References Cited

U.S. PATENT DOCUMENTS

| | | | | |
|---|---|---|---|---|
| 4,949,048 | A | * | 8/1990 | Tokumo et al. ................ 330/10 |
| 6,710,650 | B1 | * | 3/2004 | Beaudin et al. ......... 330/124 R |
| 6,734,725 | B1 | * | 5/2004 | Masuda et al. ................ 330/10 |
| 2004/0239416 | A1 | | 12/2004 | Smiley et al. |
| 2005/0062526 | A1 | | 3/2005 | Morris et al. |

* cited by examiner

*Primary Examiner*—Henry Choe
(74) *Attorney, Agent, or Firm*—Paul C. Hashim (57) ABSTRACT

Methods and apparatus are provided for efficiently combining and filtering a plurality of input signals into a single combined output signal. M number of input signals are received, combined and filtered by a filter/combiner. The filter/combiner has a plurality of input stages for each input signal, and an output stage that combines the outputs of the input stages into the combined signal. The filter/combiner has a desired overall filter transfer function designed to filter signals having frequencies outside a passband and which passes the desired M input signals.

21 Claims, 6 Drawing Sheets

METHOD AND APPARATUS FOR COMBINING MULTIPLE SIGNALS FOR HIGH EFFICIENCY APPLICATIONS

CROSS REFERENCE TO RELATED APPLICATION(S)

This application is a continuation-in-part of prior pending U.S. patent application Ser. No. 10/449,105 filed on Jun. 2, 2003 and which is incorporated herein by reference. This application is related to another commonly owned United States patent application entitled "METHOD AND APPARATUS FOR DUAL USE OF SINGLY AND DOUBLY TERMINATED NETWORKS" filed concurrently herewith, and identified by reference number 17905ROUS01U (NORT10-00477), and which is incorporated herein by reference.

TECHNICAL FIELD

The present disclosure relates generally to communication systems, and more particularly to apparatus and methods of combining multiple signals for high-efficiency applications, including amplification.

BACKGROUND

Power amplifiers account for a significant portion of the capital and operational expense in current wireless base station designs. One method of reducing this expense is to increase the overall efficiency of these amplifiers. In order to obtain high-efficiency amplifiers, one prior approach is to modulate the amplifier's PSU (power supply unit) in order to track the input envelope of the modulated signal. This in turn requires that one must have a high-efficiency PSU which supports the desire to modulate the PSU, while at the same time, does not introduce any impairments into the main signal path.

A number of high-efficiency architectures have been proposed, particularly in the audio field. However, these architectures typically consist of a single phase and are not capable of supporting the power levels and input bandwidths required for RF applications.

Improvements in efficiency of power amplifiers would benefit low-frequency, high-frequency and radio-frequency amplifier applications, ultimately providing for increased flexibility as to base station placement, particularly when efficiencies increase to the point where supplemental heat dissipation via fans and the like is no longer required.

Sigma-Delta modulation allows noise shaping such that the noise of the modulated signal lies mostly out-of-band. Filtering off the out-of-band noise substantially restores the original signal. See for example Sharp "An Overview of Sigma-Delta Converters", (IEEE Signal Processing Magazine, January 1996), SM-SX1 Sigma-Delta Audio Amplifier (IEEE Spectrum, March 2000), "Bandpass delta-sigma class-S amplifier", Electr. Letters, Vol. 36, No. 12, June 2000, "Linear High-Efficiency Microwave Power Amplifiers Using Bandpass Delta-Sigma Modulators", Jayaraman et al., IEEE Micr. & Guided Wave Letters, Vol. 8, No. 3, March 1998, "Linear Amplification by Sampling Techniques: A new application for Delta Coders", Cos, IEEE Trans. Comm., Vol. Com-23, No. 8, August 1975. Conventional applications for Sigma-Delta modulation have focused on analog inputs, and have produced single-bit outputs only. Single bit systems require a very high over-sampling rate to achieve acceptable performance. Multi-bit Sigma-Delta modulators have also been proposed. Sigma-Delta modulation takes an input signal and converts it to an N-level quantized Sigma-Delta signal. The input signal can be in the form of an analog signal or a digital signal.

Various methods and apparatus for efficiently amplifying or converting a signal, including high-efficiency amplifiers and methods, are disclosed in United States Patent Application Publication No. 2004/0239416 (Ser. No. 10/449,105 filed on Jun. 2, 2003 and published on Dec. 2, 2004) and United States Patent Application Publication No. 2005/0062526 (Ser. No. 10/858,079 filed on Jun. 2, 2004 and published on Mar. 24, 2005), each of which is incorporated herein by reference.

In most high efficiency applications, filters are utilized to reject signals in particular frequency ranges, outside a desired passband. Conventional filter implementations typically introduce dissipation into the signal processing path. Other components or processing blocks or network within the path may also increase dissipation. Therefore, there is a need for filter design and implementation (and other component design and implementation) that reduces dissipation and results in increased efficiency.

SUMMARY

In accordance with one embodiment, there is provided an apparatus for combining and filtering a plurality of M number of input signals into a single output signal, where M is an integer. The apparatus includes a plurality of M input terminals with each input terminal operable for receiving one or more of the plurality of M input signals, and a plurality of M input stages, each input stage comprising at least a one of an inductive, a capacitive and a resistive element Preferably, the M parallel input stages are substantially similar. An output stage includes at least a one of an inductive, a capacitive and a resistive element, where the output stage combines each of a plurality of signals output from the plurality of M input stages. The plurality of input stages and the output stage function together to provide a predetermined filter transfer function with a passband suitable for substantially passing the M input signals to a load and substantially rejecting signals outside the passband.

In accordance with another embodiment, there is provided a method for combining and filtering a plurality of M input signals into a single output signal. The method includes receiving a plurality of M input signals at a plurality of M input terminals. The plurality of M input signals are processed using a corresponding plurality of input stages to generate a plurality of M output signals, with each input stage having at least a one of an inductive, a capacitive and a resistive element. The plurality of M output signals from the plurality of M input states are combined into a single combined output signal at an output terminal having an output stage connected thereto, with the output stage including at least a one of an inductive, a capacitive and a resistive element. The plurality of input stages and output stage function to combine the M input signals into the single combined output signal and provide a predetermined filter transfer function from the M input terminals to the output terminal.

In yet another embodiment, there is provided a method of combining and filtering a plurality of M input signals into a single output signal. The method includes receiving a plurality of M input signals, with each input signal having frequency content in a given frequency band. A load is provided to which the frequency content of each input signal will be delivered. A filter transfer function is defined that has a passband for delivering the frequency content of all the M input signals to the load and substantially rejecting frequency content outside the passband. The M input signals are filtered and combined into a single output signal using a filter/combiner apparatus that provides the filter transfer function. This includes a plurality of M identical parallel input stages for receiving the plurality of M input signals whereby each input stage includes at least a one of an inductive, a capacitive and a resistive element. The filter/combiner further includes an output stage having at least a one of an inductive, a capacitive and a resistive element, whereby the output stage combines signals output from each of the input stages into the single combined output signal.

In another embodiment, there is provided a method of implementing a filter/combiner circuit for combining and filtering a plurality of M input signals into a single output signal. The method includes defining a predetermined filter transfer function having a passband suitable for substantially passing the M input signals to a load and substantially rejecting signals outside the passband. A model filter circuit is then defined having the predetermined filter transfer function, the model filter circuit being configured as a single input, single output filter having one or more filter components in a specific configuration. The model filter circuit is decomposed to derive the filter/combiner circuit having a plurality of M input stages and an output stage. The plurality of M input stages are operable for receiving the plurality of M input signals with each input stage including at least a one of an inductive, a capacitive and a resistive element. The output stage is operable for combining signals output from each of the plurality of M input stages into the single output signal, where the output stage including at least a one of an inductive, a capacitive and a resistive element. Each of the input stages includes one or more filter components configured substantially equivalent to at least a portion of the specific configuration of the model filter circuit. The value of the one or more filter components in the input stages is scaled from a value of the one or more filter components in the model filter circuit based upon the number M of input signals.

Other technical features may be readily apparent to one skilled in the art from the following figures, descriptions, and claims.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION

Figure 1:
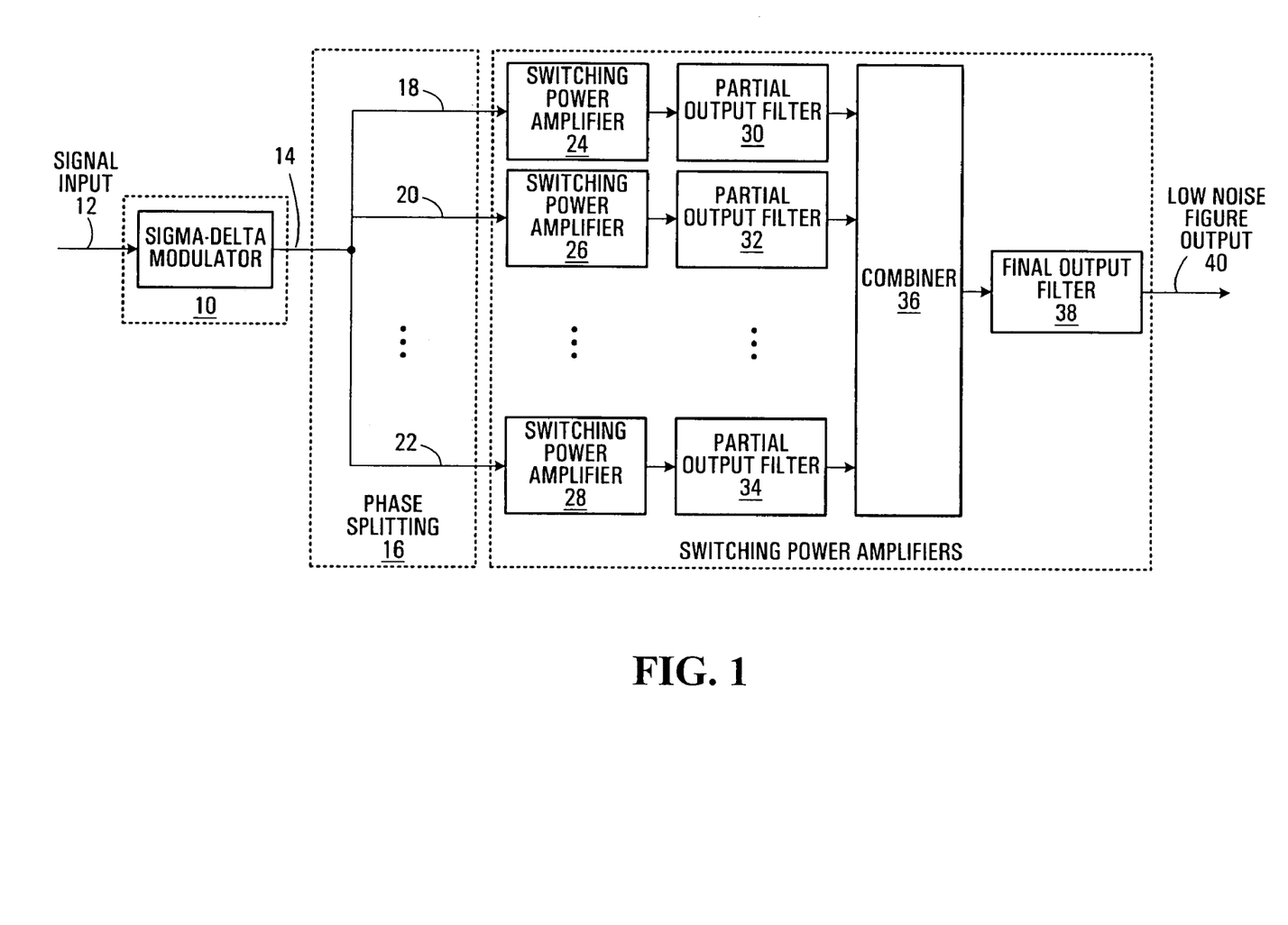
FIG. 1 is a block diagram of an amplifying system.

Referring now to FIG. 1, shown is a block diagram of a high-efficiency amplification system using an N-level Sigma-Delta modulator, $N \geq 3$ as provided by an embodiment of the invention. The Sigma-Delta modulator 10 is connected to receive an input signal and produce an N-level Sigma-Delta modulated output signal 14. A phase splitting function generally indicated at 16 takes the Sigma-Delta modulated signal 14 and produces a set of N−1 "phases" 18,20,22 (only three shown). The N−1 phases 18,20,22 collectively sum to equal the Sigma-Delta modulated signal 14 at any instant. Each of the N−1 phases 18,20,22 is connected to the input of a respective one of N−1 switching power amplifiers 24,26,28 (only three shown). The outputs of the switching power amplifiers 24,26,28 are connected to respective partial output filters 30,32,34 (only three shown). The outputs of the partial output filters 30,32,34 are connected to inputs of a combiner 36 having an output connected to a final output filter 38 which produces the overall output 40. The Sigma-Delta modulator 10 provides the benefit of noise shaping as compared to other modulation techniques. In this way, quantization noise is "pushed" out of the band of interest, allowing it to be eventually filtered off without negatively impacting the desired signal. While only three N−1 "phases," switching power amplifiers and output filters are referenced above, it is to be appreciated that the invention contemplates the provisions of a greater or lesser number of such components.

In operation, the Sigma-Delta modulator 10 processes the input signal to produce the Sigma-Delta modulated signal 14. The input signal can be an analog signal or a digital signal, and this will of course affect the implementation Sigma-Delta modulator. For RF amplifier applications, the input signal is the RF signal to be amplified. For power supply unit applications (described in detail below), the input signal is the envelope of an RF input signal. The sigma-delta modulated signal 14 consists of an N level quantized signal representable by log.sub.2(N) bits. It is noted that N does not necessarily have to be a power of 2. For example, if there are four levels, then the output of the Sigma-Delta modulator 14 can be represented by two bits. The phase splitting function 16 processes the Sigma-Delta modulated signal 14 to produce signal phases 18,20,22 which sum to equal the Sigma-Delta modulated signal. However, each of the phase signals is a two state signal meaning that it is either on or off and each of the phase signals 18,20,22 has an on state which will saturate the respective switching power amplifier 24,26,28 to which it is fed. Thus, signal phase 18 has an on state which will saturate switching power amplifier 24, phase 20 will have an on state which will saturate switching power amplifier 26, and signal phase 22 will have an on state which will saturate switching power amplifier 28. In a preferred embodiment, the on states for the N−1 phases produced in the phase splitting block 16 are equal so that the N−1 switching power amplifiers 24,26, 28 can be made identical. The phase splitting function 16 is preferably arranged to produce N−1 2-level signals, where the Sigma-Delta modulator 10 produced an N level Sigma-Delta modulated signal 14. Several examples of the phase splitting function 16 are presented in detail below.

Each of the switching power amplifiers 24,26,28 perform switching power amplification on the respective input signals 18,20,22. Any suitable switching amplifier topology can be employed. Eligible topologies include but are not limited to class D, class S, class E and class F amplifiers, and buck, boost and flyback converters. The amplified signals produced by the switching power amplifiers 24,26,28 are filtered and partial output filters 30,32,34. The outputs of the partial output filters 30,32,34 are summed with combiner 36. This can be implemented with any suitable combining technology. The combiner produces a combined signal which is output to the final output filter 38 which filters out-of-band noise to produce the overall output 40. The partial output filters and the overall output filter achieve an overall filter response. If the desired signal has a lowpass characteristic the overall filter response should be lowpass. If the desired signal is bandpass the overall filter should be bandpass. The filter matches the desired signal. Typically in the power supply or audio application the desired overall output filter response is lowpass. Those skilled in the art will know how to divide the overall response into two filters (a partial output filter and final output filter) that when combined achieved the desired overall response.

Figure 2:
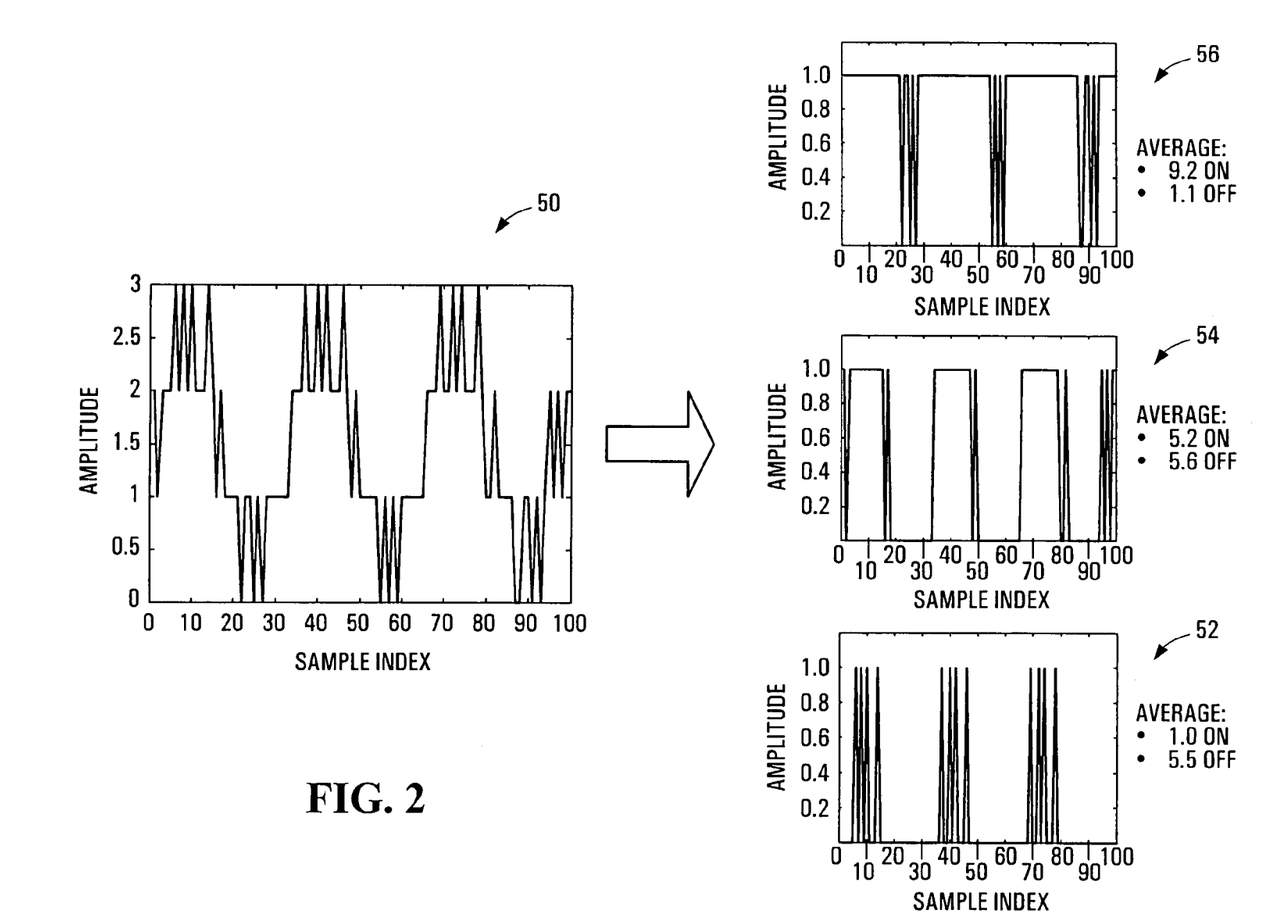
FIG. 2 is an example of how phase allocation may be performed by the phase splitting function of FIG. 1.

FIG. 2 shows a simple "thresholding" phase allocation scheme implementable in the phase splitting function 16. For this example, the Sigma-Delta modulated signal 14 of FIG. 1 is generally indicated by 50. It can be seen that this is a four level signal, with the output having either a value of 0, 1, 2, or 3 with appropriate brief transition periods between these Sigma-Delta states. With thresholding phase allocation, a first phase is simply defined to be any portion of the Sigma-Delta modulated signal greater than quantization level "2". An example of such a signal is indicated at 52. The next phase will simply be any portion of the signal greater than quantization level "1". An example of such a signal as indicated generally at 54. Finally, the third phase is simply that portion of the Sigma-Delta modulated signal which is greater than quantization level "0". An example of this is indicated generally at 56. It can be seen that a sum of signals 52,54,56 would equal the signal 50. The three signals 52,54,56 are all substantially two state signals, oscillating between 0 and 1. In this example it is of course assumed that the on state has been normalized to 1. More generally, the on state would need to be a value which saturates the switching power amplifiers. This particular phase splitting methodology has the disadvantage that the switching power amplifier responsible for amplifying the lowest phase, namely the signal content between "0" and "1" will be on much more of the time than the switching power amplifier responsible for amplifying the largest phase 52. In the illustrated example, the average on time for the lowest phase is 9.2 samples and the average off time 1.1 samples. For the medium phase, the average on time is 5.2 samples and the average off time is 5.6 samples. Finally, the average on time for the highest phase 52 is 1 sample and the average off time is 5.5 samples. It is noted that in the illustrated example, the first phase 52 has more transitions than the third phase 56. The number of transitions affects efficiency.

In another embodiment, a more intelligent phase splitting method is employed in the phase splitting function 16. This method attempts to reduce the number of switching events that will occur in each of the resulting two-level signals while at the same time equalizing the switching events between the phases. If the modulator produces equal size quantization steps, then the output of the Sigma-Delta converter can be considered to indicate how many phases of the converter need to be active, without specifying which of the phases are active. The phase splitting function 16 then allocates the on states between the phases to achieve desired switching characteristics. In a preferred implementation, there is a substantially equal distribution of on and off states among the phases. Reducing the number of transitions (off→on, on→off) increases the efficiency.

Other constraints can be imposed upon the phase splitting function 16. For example, there can be maximum on time or maximum off time for any of the switching power amplifiers.

Figure 4:
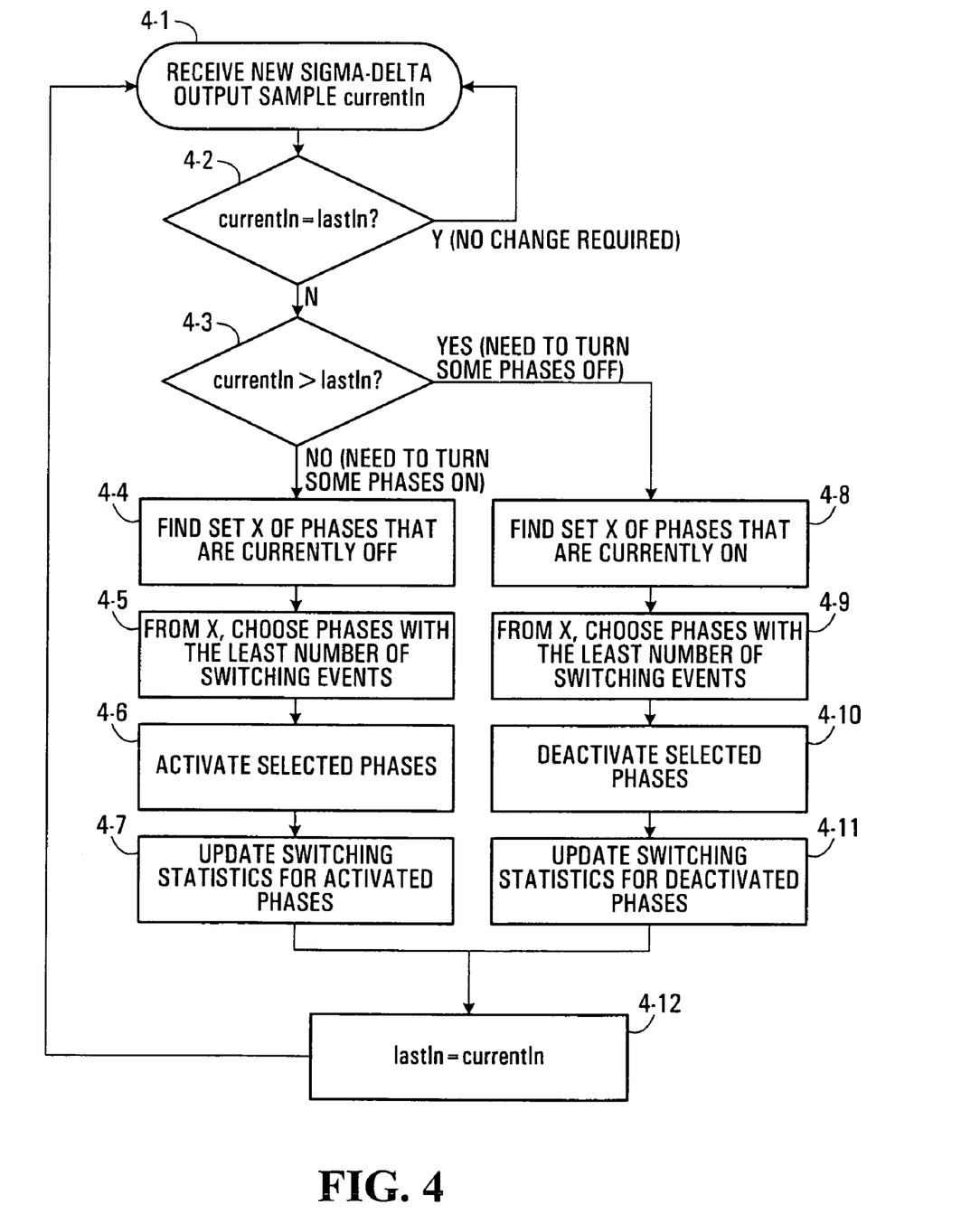
FIG. 4 is a flowchart of a method of phase allocation.

FIG. 4 is a flowchart of an example phase splitting function 16. The method begins at step 4-1 with the reception of a new Sigma-Delta output sample "currentIn". At step 4-2, if currentIn is the same as the previously processed sample referred to as "lastIn", (yes path) then the method returns to step 4-1 to process the next sample. Otherwise, at step 4-3, if currentIn is less than lastIn then some phases need to be turned off, and steps 4-8 through 4-11 are executed. Otherwise, if currentIn is greater than lastIn then some phases need to be turned on and steps 4-4 through 4-7 need to be executed. In either case, at step 4-11, lastIn is set to equal currentIn and used in subsequent processing.

In order to turn phases on, the set X of phases that are currently off are determined at step 4-4. From that set X, the phases with the least number of switching events are selected at step 4-5. The selected phases are activated at step 4-6. Finally, at step 4-7, the switching statistics for the activated phases are updated.

Similarly, to turn phases off, at step 4-8, the set X of phases that are currently on is identified. At step 4-9, from the set X the phases with the least number of switching events are chosen. At step 4-10, the selected phases are de-activated. Finally, at step 4-11, the switching statistics for the de-activated phases are updated.

This is a specific example which has been found by experimentation to yield very good results. However, it is to be understood that many other methods of distributing the switching events between the different phases may be employed within the scope of the invention.

In the above-described embodiment, each phase includes a partial filter which eliminates some of the out-of-band noise signals. After the phases are combined, the final output filter 38 eliminates any remaining out-of-band noise signals. In another alternative embodiment, there are no partial output filters 30,32,34. Rather, the outputs of the amplifier phases are directly combined so that the sum of each phase results in the original desired signal including out-of-band noise signals generated by the sigma-delta modulator 10. A filter is then applied to the combined output signal to exclude the out-of-band noise while retaining the desired original signal. In another alternative embodiment, each amplifier phase includes a respective filter that entirely excludes the out-of-band noise signal. The summation of the phases thus filtered would then only include the desired original signal. In this case, there would be no requirement for the final output filter 38 of FIG. 1.

Figure 3:
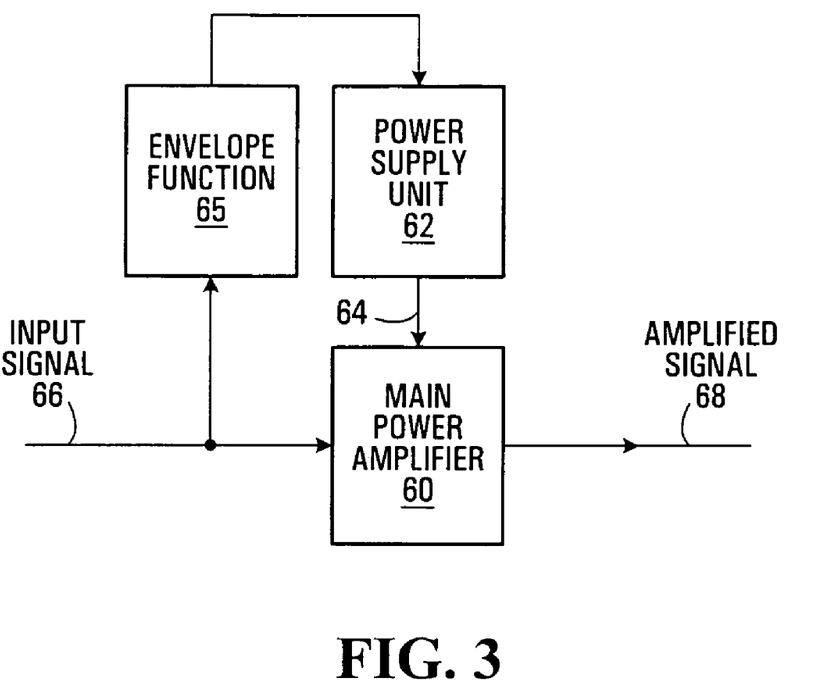
FIG. 3 is a block diagram of a power supply unit application of the amplifier of FIG. 1.

In the above-described embodiment, the new amplification approach has been applied directly to an input signal to produce an amplified output signal. In another embodiment, the method is applied to an N amplifier PSU in order to track the input envelope of the main amplifier. A block diagram of this embodiment is shown in FIG. 3. In this embodiment, shown is a main power amplifier 60 powered by a power supply unit 62. The power supply unit is a high-efficiency amplifier using Sigma-Delta modulation, for example as shown in FIG. 1. This generates a power supply signal 64 which powers the main power amplifier 60. The input signal 66 is amplified by the main power amplifier 60 to produce an amplified output signal 68. The input signal 66 is also fed through an envelope function 65 to the input of the power supply unit 62 such that the power supply signal 64 tracks the envelope of input signal.

The above example implementation has focused on the use of a Sigma-Delta modulator to generate the quantized signal, and a phase splitting function 16 to generate the various phases. More generally, any appropriate circuit or method can be employed to decompose an input signal into a set of phases each one of which will independently drive a respective switching power amplifier between an off state and a saturation state. The Sigma-Delta modulator approach has the advantage of shifting the noise outside the operational bandwidth, and as such allows the noise to be very easily filtered off. However, it is to be understood that other modulation methods will have their own noise characteristics which can be dealt with in their own way.

Any suitable hardware implementation can be used to build the architecture of FIG. 1. For example, in one embodiment the Sigma-Delta modulator is on a first circuit, for example an ASIC or FPGA. The phase splitting function 16 is a second circuit. Each of the switching power amplifiers is a respective circuit, and the output filters, combiners and final output filters together are a separate circuit. This results in a total of N+3 circuits to build the architecture. Of course, it is to be understood that other combinations of functionality on different circuits could be employed. Furthermore, it is to be understood that the phase splitting function 16 could be implemented in software. Furthermore, some implementations of the Sigma-Delta modulator 10 could be implemented partially or completely in software. The filtering functions may be implemented using special purpose filters implemented in hardware, or maybe implemented using general purpose filter blocks which are tuned to achieve the desired function, or other filtering technology can alternatively be employed.

It is noted that increasing N (the number of levels) improves noise performance without having to increase the over-sampling ratio as large as would be required in single bit Sigma-Delta applications. Preferably, N is minimized subject to a constraint of meeting the required noise performance and subject to $N \geq 3$.

Similar methods and apparatus may be utilized for increased efficiency in converter applications, such as described in United States Patent Application Publication No. 2005/0062526 (Ser. No. 10/858,079 filed on Jun. 2, 2004 and published on Mar. 24, 2005).

The foregoing described methods and apparatus provide for increased efficiency in the particular applications using conventional combiners and filters for the combiner 36, the partial output filters 30, 32, 34 and/or the final output filter 38. It has been determined that additional concepts, methods and apparatus, as will be described below, may be implemented in these types of applications to further increase efficiency. Other applications may benefit from these concepts, methods and apparatus as well.

In high power applications, outputs of multiple lower power amplifiers are combined to achieve some overall gain and output power requirement and increase efficiency. Utilization of a conventional combiner, such as a Wilkinson, a hybrid or a resistive combiner, provides some degradation in the efficiency of the application. In conventional amplifiers, Wilkinson and hybrid combiners are typically designed to match specified source and load impedances. Thus, these are less than optimal for high efficiency power amplifier applications and for providing a specific filter transfer function. In a Wilkinson combiner, the isolating resistor may cause failures when the input signals are not coherent (of the same or similar frequency, magnitude and phase), and the combination of greater than two input signals becomes problematic due to the dimensional connectivity required between inputs. A hybrid combiner generally requires some source and load terminations, and in some applications, may not be capable of providing the needed source termination. A resistive combiner, though broadband and simple, is substantially lossy resulting in reduced efficiency.

In a particular application, switch mode power supplies (buck, boost, etc.) commonly use parallel output filters to deliver additional power to the load. However, due to the nature of a DC power supply, the common design process is to attempt to reject all non-DC components in the signal and minimize transient overshoot to prevent the power supply from damaging the actual circuits to which it is supplying power. Thus, these design constraints may result in circuitry unsuitable for passing some specific band of frequencies that may or may not include DC.

One aspect of the present disclosure is directed to, generally, the combination of M input signals (voltage or current domain) that may or may not have any particular relationship among the M signals with respect to magnitude or phase. The frequency spectra of the M signals may also not be specifically related, other than each M input signal has content in a known frequency band, and the overall passband is fixed and known.

In the design phase, given a known load to which the desired frequency content of the M inputs signals is to be delivered or applied, a filter transfer function (lowpass, highpass, bandpass, bandstop, etc.) is designed to deliver the M inputs signals to the load and reject or filter other frequencies using conventional approximations (e.g., Butterworth, Chebyshev, etc.).

This filter transfer function is synthesized (or implemented) from the perspective of a single input, single output (i.e., M=1). The filter transfer function is then implemented using a network of known circuit elements, such as capacitive and inductive elements. Other suitable elements may be utilized as components in the filter, including transmission lines, cavities, crystals, and the like.

The filter synthesis or implementation may take the form or type of a "singly terminated" or "doubly terminated" network, which are known and understood by those skilled in the art. As will be appreciated, if the implementation is singly terminated, the design may be in the voltage mode or current mode, which is also known and understood in the art. Further, the filter may also be implemented as either single-ended or differential.

Once the filter network is designed, it is decomposed or modified from the single input, single output configuration into a multiple inputs, single output configuration by segmentation into an output section and multiple parallel input sections. The parallel input sections are thus related to the original single input, single output filter implementation by an identical circuit topology as the equivalent components with impedance scaling.

Figure 5:
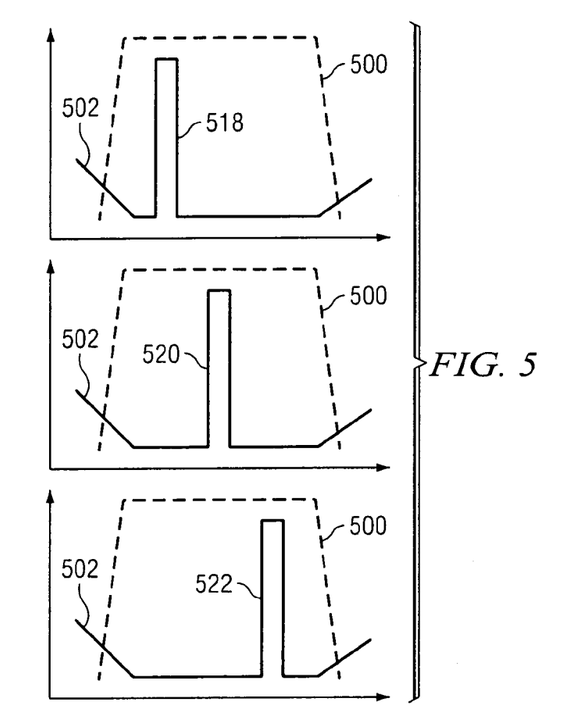
FIG. 5 includes three diagrams illustrating a frequency chart for each of three different input signals.

A specific example may be useful to illustrate the above concepts, methods and apparatus. Now referring to FIG. 5, there are shown three diagrams illustrating a frequency chart for each of three different signals. The spectra of each of three input signals 518, 520, 522 is shown in each respective diagram. The signals 518, 520, 522 are the same or similar to the three input signals 18, 20, 22 in FIG. 1. Shown in dotted lines and identified by reference numeral 500 is an overall filter transfer function showing the desired frequency content of the three (M=3) signals 518, 520, 522. In the embodiment shown, the filter transfer function is bandpass and passes the frequencies of the signals. Also shown is noise 502 out of the band of interest.

Figure 6:
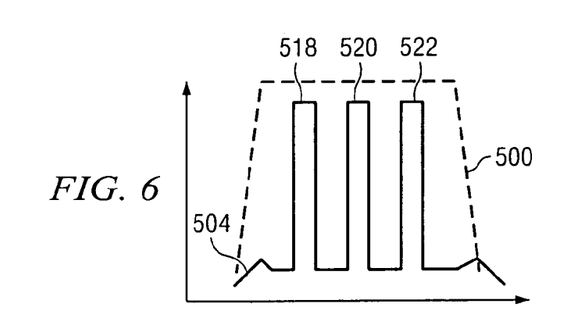
FIG. 6 is a diagram illustrating the spectra of an output signal after combining three signals therein.

Now referring to FIG. 6, there is illustrated the spectra of an output signal with the combined signals 518, 520, 522, in accordance with the present disclosure. As illustrated, out of band noise 504 is shown reduced.

Figure 7:
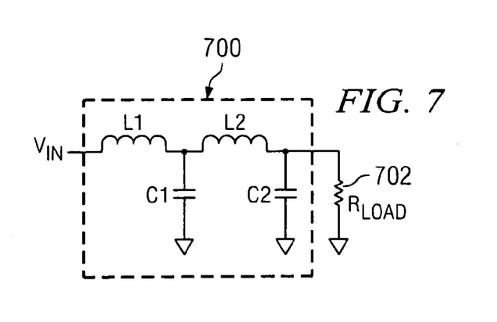
FIG. 7 is a circuit diagram illustrating a filter transfer function modeled in a single input, single output configuration.
Figure 8:
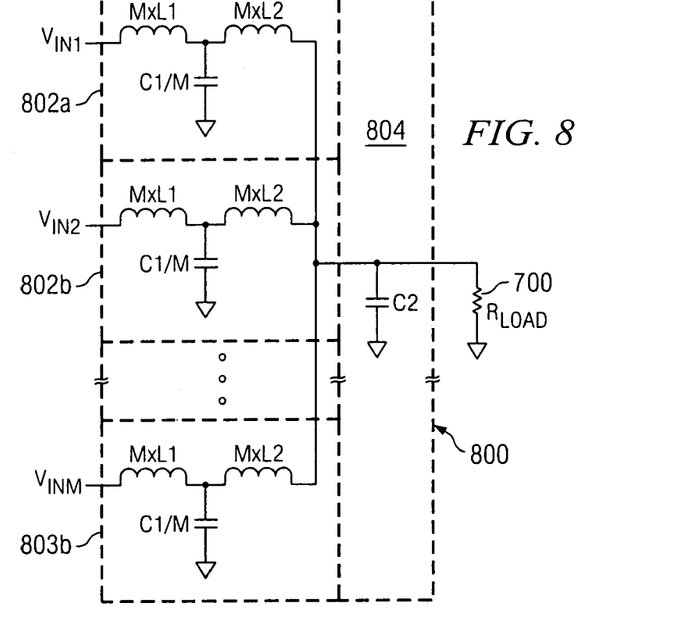
FIG. 8 is a circuit diagram illustrating the filter transfer function modeled in FIG. 7 and decomposed into a multiple input, single output configuration.

Now referring to FIGS. 7 and 8, there is illustrated one implementation of a given filter transfer function modeled in a single input, single output configuration (FIG. 7) and as decomposed into a multiple input, single output configuration (FIG. 8) in accordance with the present disclosure. The present disclosure allows for the implementation of a combination filter/combiner for combining and filtering M inputs signals and generating a single combined output signal.

Given a load 702 (Rload) to which a band of frequencies are to be delivered (or applied) and given a desired filter transfer function for filtering this frequency band, a specific filter implementation is chosen. For example, assuming a $4^{th}$ order bandpass filter function is desired, a filter or filter network 700 (shown in dotted lines) may be implemented using various components. In one embodiment, as shown, the filter 700 includes a filter network having inductive and capacitive components, namely, inductors L1, L2 (inductive elements) and capacitors C1, C2 (capacitor elements). It will be understood that fewer, more and/or different components may be utilized, as known in the art, to implement the desired filter transfer function. Inductive, capacitive and/or resistive elements in various forms and implementations may be used, including transmission lines, resonant cavities, and other methods of implementing filters known in the art.

In a preferred embodiment, no resistive elements are included in the filter network 700 to implement the desired filter transfer function. Though inductive and/or capacitive elements and conductors of the filter network 700 may include some inherent resistance therein, no resistive elements are intentionally implemented, thus the filter network 700 and/or input stages 802 are devoid of added resistive elements. Moreover, though described as an inductive, capacitive and resistive elements, a single element or device may be used that includes one or more of these types of elements. Thus, for example, a single element or device may include both inductance and capacitance.

The filter 700 is then decomposed or modified from a single input, single output configuration to a multiple input (M signals), single output configuration or filter network 800. This is done by implementing M parallel input sections 802a, 802b, 802c and a single output section 804. The components (type and/or configuration) of the filter network 800 are generally the same or equivalent components utilized in the filter network 700. Thus, the implementation of the filter circuit 700 is used as a model to derive the filter/combiner circuit 800.

In this embodiment, each input section 802 is identical and includes two inductors L1, L2 and one capacitor C1. The parallel input sections 802 are related to the original filter implementation (single input, single output) 700 by similar circuit topology having equivalent components but with impedance scaling based on the number of M inputs. Thus, in the embodiment shown, the inductive elements L1, L2 are scaled such that their values are M×L1 and M×L2, respectively, and the capacitive element C1 is scaled to a value C1/M. The output section 804 includes a capacitive element C2 that is equivalent to the capacitive element (C2) in the filter 700, with no scaling. The input signals are shown denoted by Vin (1 through M), but may also be current mode signals.

It will be understood by those skilled in the art that different circuit implementations of the given filter transfer function may be utilized and (depending on the circuit configuration) when decomposed or modified to receive and combine M input signals, appropriate impedance scaling may be required.

In one specific embodiment, the filter/combiner network 800 designed with the desired characteristics and in accordance with the present disclosure may be utilized in the amplifying system of FIG. 1. It will be understood that the filter/combiner 800 may be substituted for the multiple partial output filters 30, 32, 34 and the combiner 36. Optionally, the filter/combiner 800 may be substituted for the multiple partial output filters 30, 32, 34, the combiner 36 and the final output filter 38.

The concepts, methods and apparatus may be implemented in other signal processing applications, where it is desirable to combine M input signals into a single output signal with filtering resulting in little or no dissipation or decrease in efficiency.

As will be appreciated, in one embodiment, the present disclosure provides or allows high power combining of signals in a way that a specific filter function may be utilized to provide broadband, well-defined power combining. In the context of switching applications, utilization of a single terminated filter (with combiner) as described herein, provides high efficiency combining and power amplification because the out of band frequencies of the input signal(s) are rejected with little or no dissipation.

The foregoing filter/combiner network 800 provides a distinct difference from the partial output filters 30, 32, 34 and final output filter 38. For the filters 30, 32, 34, 38, a defined response may be determined from the input terminal to the output terminal. However, for the each of the input sections 802 of filter 800 no defined response can be seen or measured. Thus, the input sections 802 do not appear conventional in that they generally cannot be designed independently of the combiner function and output section 804 of the filter 800.

Such distinction leads to another aspect and advantage of the present disclosure—the filter/combiner 800 is a singly terminated network. In switching amplifier applications, utilization of a singly terminated filter provides substantial increases in efficiency over doubly terminated filters or networks. It will be understood that although a substantial increase in efficiency may be gained in accordance with the present disclosure, such increase in efficiency may be partially offset by coupling the singly terminated network 800 to a doubly terminated network (such as additional filters or components, e.g., duplex filter, matching network inside a power amplifier, etc.) which may increase dissipation, but will result in a distorted filter response (and poor reproduction and combining of the desired input signals).

It has been determined that a better filter response may be achieved within an architecture of a singly terminated network coupled to a doubly terminated network by implementing an isolation mechanism between the singly terminated network and the double terminated network. Though the isolation mechanism may increase dissipation, achieving the desired filter response at the expense of slightly increasing dissipation is important.

A doubly terminated network requires source and load resistances that are neither zero or infinite. Thus, when connected to a singly terminated network (having zero source and load resistances in a voltage mode and infinite resistances in a current mode), the doubly terminated network sees either a zero or infinite load resistance. Due to this, the overall transfer function (response) of the combined network may include distortion and undesirable effects resulting in a less than desired transfer function. This may result in reinforcement of undesirable frequencies and/or degradation of desired frequencies in transmitting the input signal(s) to a load resistance through the two networks. Prior art solutions simply connected the two types of networks together and did not take into account what effects may arise in this simple configuration.

The present disclosure, therefore, broadly provides a singly terminated network connected to a doubly terminated network with an isolating device coupled therebetween. In one embodiment, the singly and doubly terminated networks are filters.

Figure 9:
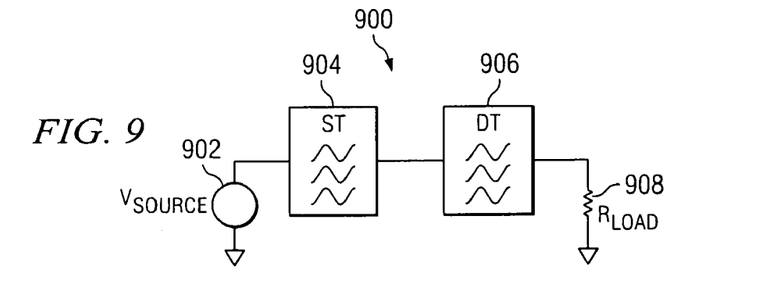
FIG. 9 is a diagram illustrates one embodiment of an apparatus having a singly terminated network and a doubly terminated network in accordance with the present disclosure.

Now referring to FIG. 9, there is shown a diagram illustrating a filtering apparatus 900 receiving a signal from a source (Vsource) 902 for input to a single terminated (ST) network 904. The output of the ST network 904 is connected to the input of a doubly terminated (DT) network 906. In the implementation shown, the ST network 904 and DT network 906 each provide a filtering function having a specified or given passband. The output of the DT network 06 is coupled to a given load resistance (Rload) 908. The term "network" may be used interchangeably with "circuit" or "device." As will be appreciated, the signal source 902 may include one or more signals (such as M).

The DT network 906 may be any doubly terminated network/circuit. In a more specific implementation within a power amplifier system, the DT network 906 may include any type of filter, such as a duplex filter, and may optionally include a matching network (not shown).

The ST network 904 may be any singly terminated network/circuit. In one embodiment, the ST network 904 is the same as or similar to the filter network 800 shown in FIG. 8, and another embodiment, the ST network 904 is the same as or similar to the filter network 700 shown in FIG. 7.

When the ST network 904 is implemented as the filter network 800 for an amplification system, it provides increased efficiency desirable for high power applications. However, because the ST network 904 is singly terminated and connected to a doubly terminated network 904, there may be some reduction in the efficiency due to this configuration and some distortion in the filter response, as noted above. Thus, the present disclosure provides apparatus and methods for increasing efficiency (or reducing loss or dissipation) when a singly terminated network is connected to a doubly terminated network.

Figure 10:
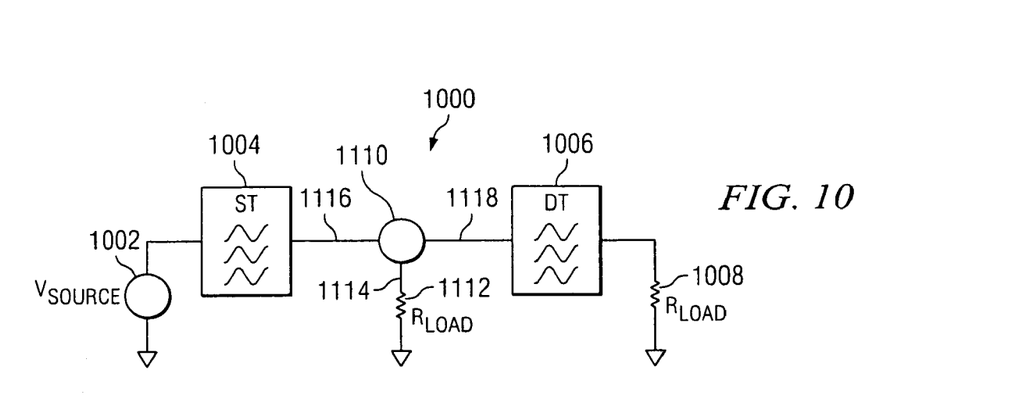
FIG. 10 is a diagram illustrates another embodiment of an apparatus having a singly terminated network and a doubly terminated network in accordance with the present disclosure.

Now referring to FIG. 10, there is shown a diagram illustrating a filtering apparatus 1000 receiving a signal from a source (Vsource) 1002 for input to a single terminated (ST) network 1004. The output of the ST network 1004 is connected to the input of an isolation network (or isolator) 1110. The output of the isolation network 110 is connected to a doubly terminated (DT) network 1006. The output of the DT network 1006 is coupled to a given load resistance (Rload) 1008. A third terminal of the isolation network 1008 is connected to a second load resistance (Rload) 1112. In the implementation shown, the ST network 1004 and DT network 1006 each provide a filtering function. Again, the term "network" may be used interchangeably with "circuit" or "device," and the signal source 1002 may include one or more signals (such as M).

As will be appreciated, the load resistances 908 and 1008 are generally the required load resistance (i.e., end load) to which the systems are designed.

The isolator device 1110 is a three terminal device whereby an input signal(s) is transmitted from the input terminal to the output terminal and any signal energy reflected from the load (at the output terminal) is transmitted to a third "isolating" terminal or port 1114. A circuit or device 112 at the isolating terminal 1114 absorbs or directs the reflected energy away from the isolator device 1110. In one embodiment, the device 1112 is a resistive element (Rload).

In one embodiment, the isolator device 1110 is a passive device, such as an isolator or circulator, which are known to those skilled in the art. For example, the isolator device 1110 may be constructed or implemented as a stripline junction. Desirably, the isolator device, such as a circulator, functions to transmit energy from the input terminal (terminal 1) 1116 to the output terminal (terminal 2) 1118 to the isolation terminal (terminal 3) 1114 and back to the input terminal 1116. The goal is to prevent reflection of energy from the output terminal 1118 back to the input terminal 1116. Thus, energy reflected by the output terminal 1118 is dissipated by the circuit 1112 at the isolation terminal 1114 before reaching the input terminal 1116.

Generally, if the source impedance at the input terminal 1116 is equal to the load impedance on the output terminal 1116, no energy is reflected. Generally, the circuit 1112 is designed to have a load resistance equal to the load impedance seen by the output terminal 1118 of the isolator device 1110. When utilizing the isolator device 1110, the DT network 1006 always sees its required source resistance and the ST network 1004 always sees its required load resistance. This results in the expected combined transfer function of the ST network 1004 and DT network 1006.

The concepts, apparatus and methods of the present disclosure, as described in the foregoing, allows high efficiency amplification for any applications, and is particularly useful for high power applications, such as within power amplifiers/amplification in a transmitter.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system or part thereof that controls at least one operation. A controller may be implemented in hardware, firmware, software, or some combination of at least two of the same. The functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus for combining and filtering a plurality of M number of input signals into a single output signal, the apparatus comprising:
 a plurality of M input terminals, each input terminal operable for receiving one or more of the plurality of M input signals;
 a plurality of M input stages, each input stage comprising at least a one of an inductive, a capacitive and a resistive element;
 an output stage comprising at least a one of an inductive, a capacitive and a resistive element, the output stage combining each of a plurality of signals output from the plurality of M input stages; and
 wherein the plurality of input stages and the output stage function together to provide a predetermined filter transfer function with a passband suitable for substantially passing the M input signals to a load and substantially rejecting signals outside the passband.

2. The apparatus in accordance with claim 1 wherein the plurality of input stages are derived from a model single input, single output filter, defined as a predetermined desired filter circuit implementation configured as a single input, single output filter circuit having the predetermined filter transfer function;
 wherein a value of the at least one of the inductive, the capacitive and the resistive element in each input stage is scaled based upon the number M of input signals; and
 wherein the predetermined desired filter circuit has a first element and a second element in a specific configuration, and wherein each of the input stages is configured substantially equivalent thereto.

3. The apparatus in accordance with claim 1 wherein each input stage comprises a first inductive element and a first capacitive element.

4. The apparatus in accordance with claim 3 wherein the input stage is devoid of any resistive elements.

5. The apparatus in accordance with claim 3 wherein the value of the first inductive element and the value of the first capacitive element are scaled by the number M from values of corresponding inductive and capacitive elements of a model single input, single output filter.

6. The apparatus in accordance with claim 1 wherein the apparatus is a singly terminated filter network.

7. A method for combining and filtering a plurality of M input signals into a single output signal, the method comprising:
 receiving a plurality of M input signals at a plurality of M input terminals;
 processing each of the plurality of M input signals using a corresponding plurality of substantially similar parallel input stages and generating a plurality of M output signals, each input stage comprising at least a one of an inductive, a capacitive and a resistive element;
 combining the plurality of M output signals from the plurality of M input stages into a single combined output signal at an output terminal, the output terminal having coupled thereto an output stage comprising at least a one of an inductive, a capacitive and a resistive element; and
 wherein the plurality of input stages and output stage function to combine the M input signals into the single combined output signal and provide a predetermined filter transfer function from the M input terminals to the output terminal.

8. The method in accordance with claim 7 wherein the plurality of input stages have been derived from a model single input, single output filter, defined as a predetermined desired filter circuit implementation configured as a single input, single output filter circuit having the predetermined filter transfer function.

9. The method in accordance with claim 8 wherein a value of the at least one of the inductive, the capacitive and resistive element in each input stage is scaled based upon the number M of input signals.

10. The method in accordance with claim 9 wherein the value of the at least one of the inductive, the capacitive and the resistive element in each input station are scaled by the number M from values of any corresponding inductive, capacitive and resistive elements in the model single input, single output filter.

11. The method in accordance with claim 8 wherein the predetermined filter transfer function has a passband suitable for substantially passing the M input signals to a load and substantially rejecting signals outside the passband.

12. The method in accordance with claim 8 wherein the predetermined desired filter circuit has a first inductive element and a second capacitive element in a specific configuration, and wherein each of the input stages is configured substantially equivalent thereto.

13. The method in accordance with claim 7 wherein the plurality of M input stages and the output stage collectively exhibit characteristics of a singly terminated filter network.

14. The method in accordance with claim 7 wherein the input stage is devoid of any resistive elements.

15. A method of combining and filtering a plurality of M input signals into a single output signal, the method comprising:
 receiving a plurality of M number of input signals, each input signal having frequency content in a given frequency band;
 providing a load resistance to which the frequency content of each input signal will be delivered;
 defining a filter transfer function having a passband for delivering the frequency content of all the M input signals to the load and substantially rejecting frequency content outside the passband; and
 filtering and combining the M input signals into a single combined output signal using a filter/combiner apparatus that provides the filter transfer function, the apparatus including,
  a plurality of M identical parallel input stages for receiving the plurality of M input signals, each input stage comprising at least a one of an inductive, a capacitive and a resistive element, and
  an output stage comprising at least a one of an inductive, a capacitive and a resistive element, the output stage combining signals output from each of the input stages into the single combined output signal.

16. The method in accordance with claim 15 wherein defining the filter transfer function further comprises:
 defining a model filter circuit configured as a single input, single output filter having the filter transfer function; and
 decomposing the model filter circuit into the plurality of M identical input stages, each input stage operable for receiving a one of the plurality of M input signals, and into the output stage, the input stages and output stage providing the filter transfer function.

17. The method in accordance with claim 16 further comprising:

providing a filter circuit implementation for each of the input stages that is substantially equivalent to at least a substantial portion of the model circuit filter implementation.

18. The method in accordance with claim 17 wherein the predetermined filter circuit implementation has a first element and a second element in a specific configuration, and wherein each of the input stages is configured substantially equivalent thereto.

19. The method in accordance with claim 15 wherein the plurality of input stages and output stage are devoid of any resistive elements.

20. The method in accordance with claim 15 wherein the value of the at least one of the inductive, the capacitive and the resistive element in each input stage is based at least in part on the number of M input signals.

21. A method of implementing a filter/combiner circuit for combining and filtering a plurality of M input signals into a single output signal, the method comprising:

defining a predetermined filter transfer function having a passband suitable for substantially passing the M input signals to a load and substantially rejecting signals outside the passband;

defining a model filter circuit having the predetermined filter transfer function, the model filter circuit configured as a single input, single output filter having one or more filter components in a specific configuration;

decomposing the model filter circuit to derive the filter/combiner circuit having a plurality of M input stages and an output stage, wherein the plurality of M input stages are operable for receiving the plurality of M input signals, each input stage including at least a one of an inductive, a capacitive and a resistive element, and the output stage operable for combining signals output from each of the plurality of M input stages into the single output signal, the output stage including at least a one of an inductive, a capacitive and a resistive element; and wherein each of the input stages includes one or more filter components configured substantially equivalent to at least a portion of the specific configuration of the model filter circuit and wherein a value of the one or more filter components in the input stages is scaled from a value of the one or more filter components in the model filter circuit based upon the number M of input signals.

* * * * *